United States Patent [19]
Lesmeister

[11] Patent Number: 5,994,938
[45] Date of Patent: Nov. 30, 1999

[54] SELF-CALIBRATING PROGRAMMABLE PHASE SHIFTER

[75] Inventor: Gary J. Lesmeister, Hayward, Calif.

[73] Assignee: Credence Systems Corporation, Fremont, Calif.

[21] Appl. No.: 09/016,757

[22] Filed: Jan. 30, 1998

[51] Int. Cl.[6] .............................. H03L 7/08; H03K 5/13
[52] U.S. Cl. ...................... 327/277; 327/276; 327/243; 327/158
[58] Field of Search ..................................... 327/155, 156, 327/158, 159, 161, 233–235, 243, 244, 245, 258, 269–271, 276–278

[56] References Cited

U.S. PATENT DOCUMENTS

| | | | |
|---|---|---|---|
| 5,629,651 | 5/1997 | Mizuno ................................ | 327/158 |
| 5,712,582 | 1/1998 | Yokota et al. ........................ | 327/156 |
| 5,847,617 | 12/1998 | Reddy et al. ............................ | 331/57 |

*Primary Examiner*—Timothy P. Callahan
*Assistant Examiner*—Eunja Adolphe
*Attorney, Agent, or Firm*—Smith-Hill and Bedell

[57] ABSTRACT

A self-calibrating programmable phase shifter includes a tapped delay line for successively delaying a periodic reference signal to produce a set of phase distributed tap signals. A multiplexer selects one of the tap signals as input to a programmable delay circuit which further delays the selected tap signal to produce an output signal that is phase shifted from the reference signal. A conversion table converts input data indicting a desired phase shift between the reference signal and the output signal into output data for controlling the multiplexer selection and the amount of delay provided by the programmable delay circuit. The phase shifter includes calibration circuitry that convert the phase shifter into an oscillator by feeding the output signal back as input to the tapped delay line and adjusting relationships between the conversion table input and output data so that the period of the output signal has a desired linear relationship to the input data value.

24 Claims, 5 Drawing Sheets

SELF-CALIBRATING PROGRAMMABLE PHASE SHIFTER

BACKGROUND OF THE INVENTION

1. Field of the Invention

The present invention relates in general to a programmable phase shifter for phase shifting a periodic input signals by an adjustable amount, and in particular to a self-calibrating programmable phase shifter.

2. Description of Related Art

Figure 1:
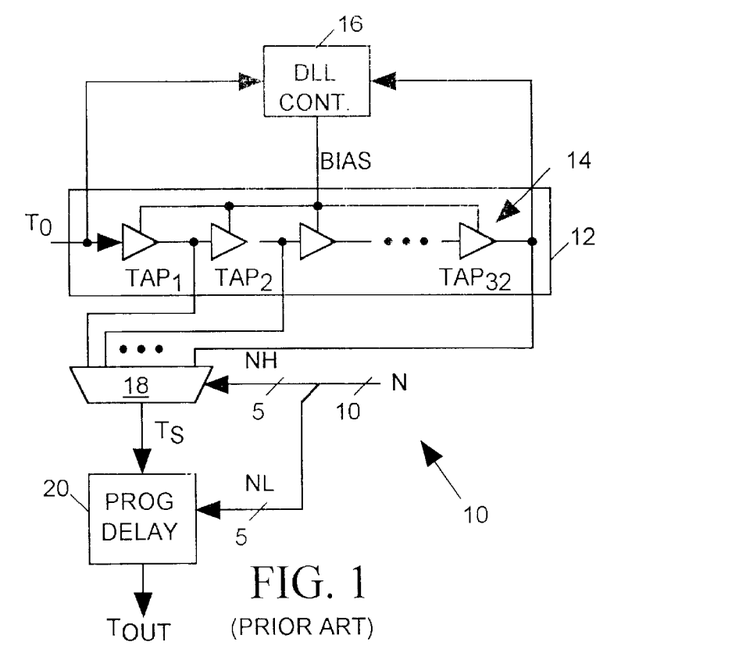
FIG. 1 illustrates prior art programmable phase shifter in block diagram form.

FIG. 1 illustrates a prior art programmable phase shifter 10 for phase shifting a periodic input signal $T_0$ by an adjustable phase angle to produce an output signal $T_{OUT}$. The phase angle is controlled by, for example, 10-bit input control data N. Ideally phase shifter 10 should provide a phase shift between $T_0$ and $T_{OUT}$ of $(N/N_{MAX})P_0$ where $P_0$ is the period of the $T_0$ signal and $N_{MAX}$ is the maximum value of N. Since N is a 10-bit number, $N_{MAX}$ may be as large as 210–1. However the actual phase shift shifter 10 provides will deviate from the ideal linear function of N.

Phase shifter 10 includes a tapped delay line 12 formed by a set of differential or single-ended buffers 14 connected in series for successively delaying the T0 signal to produce a set of L "tap" signals $TAP_1-TAP_L$ at the buffer outputs. L may be any value larger than 1 and is determined by the number of buffers forming delay line 12. In the example illustrated in FIG. 1, L is 32. Each successive tap signal $TAP_1-TAP_{32}$ is delayed from its preceding tap signal by the inherent delay of an buffer 14. The $T_0$ and $TAP_{32}$ signals are applied as inputs to a conventional delay lock loop (DLL) controller 16 that provides a BIAS signal to each buffer 14. The BIAS signal controls the inherent delay of each buffer 14. DLL controller 16 adjusts the BIAS signal so that the $TAP_{32}$ signal is phase locked to the $T_0$ signal. Thus the total delay between $T_0$ and $TAP_{32}$ is equal to the period $P_0$ of $T_0$. When all buffers 14 are similar, each buffer's delay is close to the average buffer delay of $P_0/32$. However there will be some variation in buffer delay due to process or environmental differences between the buffers.

The tap signals $TAP_1-TAP_{32}$ provide inputs to a multiplexer 18 controlled by the upper five bits NH of 10-bit input control data N. Multiplexer 18 selects one of its input signals $TAP_1-TAP_{32}$ and provides it as an input signal $T_S$ to a programmable delay circuit 20. Delay circuit 20 delays the $T_S$ signal by from 0 to 31 "unit delays" where a unit delay is $P_0/(L*N_{MAX})$. The amount of the delay provided by delay circuit 20 is selected by the lower five bits NL of control data N. Thus the 10-bit input control data N controls the phase shift between $T_0$ and $T_{OUT}$ with a nominal resolution of $P_0/2^{10}$.

While the resolution of phase shifter 10 is nominally $P_0/N_{MAX}$, various factors affect the accuracy of the phase shift that it provides. Deviation in inherent delay of any buffer 14 from $P_0/32$ and any error in the delay provided by programmable delay circuit 20 will render the phase shift between $T_0$ and $T_{OUT}$ a non-linear function of N. Also the inherent signal path delay through multiplexer 18 will introduce an offset into the phase shift between $T_0$ and $T_{OUT}$. When the various delays provided by programmable delay circuit 20 are adjustable, phase shifter 10 can be calibrated by monitoring the phase shift between $T_0$ and $T_{OUT}$ and adjusting the delay provided by programmable delay circuit 20 for each value of NL. However such a manual calibration process is tedious and time consuming.

What is needed is a phase shifter that provides a linear relationship between the phase shift it provides and the value of its input control data and that can be quickly and accurately calibrated.

SUMMARY OF THE INVENTION

A self-calibrating programmable phase shifter phase shifts a periodic input signal $T_0$ having a period $P_0$ to produce an output signal $T_{OUT}$. The phase shifter includes a tapped delay line consisting of a set of $L=2^F$ similar delay elements where F is an integer greater than two. The delay elements are connected in series for successively delaying the $T_0$ signal to produce a set of $L=2^F$ output tap signals $TAP_1-T_L$. The delay elements have delays averaging $P_0/L$ so that $T_L$ is phase locked to $T_0$ and so that tap signals $TAP_1-T_L$ are distributed in phase in steps averaging $P_0/L$. A multiplexer selects one of the tap signals and delivers it as an input signal $T_S$ to a programmable delay circuit. The programmable delay circuit delays the $T_S$ signal by an adjustable amount ranging from $0-P_0/L$ in steps averaging $P_0/2^G L$, where G is an integer greater than two, to produce the output signal $T_{OUT}$. A lookup table converts an input data word N indicating a desired phase shift into F+G bit output data $M_N$. The multiplexer's tap selection is controlled by the upper F bits of the $M_N$ data while the delay of programmable delay circuit is controlled by the lower G bits control data word.

In accordance with one aspect of the invention, the phase shifter carries out an automatic self-calibration procedure in which it adjusts the value of $M_N$ produced by its lookup table for each possible value of N so that the phase shift between $T_0$ and $T_{OUT}$ is a linear function of N.

In accordance with another aspect of the invention, during the self-calibration procedure, the phase shifter supplies its $T_{OUT}$ signal to the tapped delay line instead of $T_0$ so that $T_{OUT}$ oscillates with a period controlled by $M_N$. The phase shifter then adjusts the value of $M_N$ produced by the lookup table for each value of N so that the period of $T_{OUT}$ is a desired linear function of N. Since, for any value of N the phase shift between $T_0$ and $T_{OUT}$ when $T_0$ drives the tapped delay line is equal to the period of $T_{OUT}$ during calibration when the $T_{OUT}$ drives the tapped delay line, the calibration procedure establishes the desired linear relationship between N and the phase shift.

It is accordingly an object of the invention to provide an apparatus for phase shifting a periodic input signal wherein the amount of the phase shift is a linear function of an input data value.

It is another object of the invention to provide a programmable phase shifter that accurately calibrates itself.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 2:
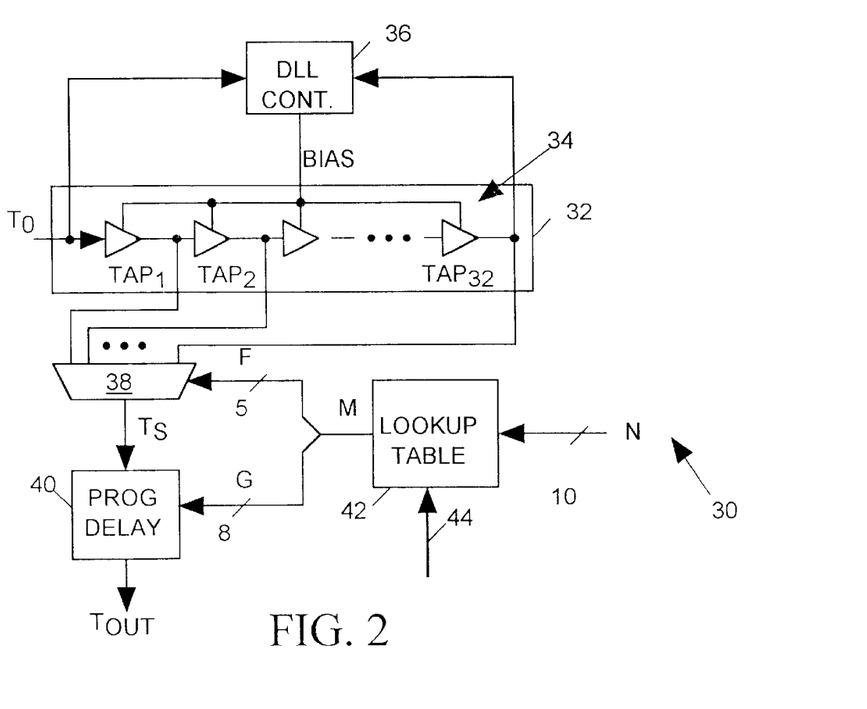
FIG. 2 illustrates an improved programmable phase shifter in block diagram form.

FIG. 2 illustrates a phase shifter 30 in accordance with the present invention that is an improved version of prior art phase shifter 10 of FIG. 1. Phase shifter 30 provides a phase shift between an input signal $T_0$ and an output signal $T_{OUT}$ of $(N/N_{MAX})P_0$ where $P_0$ is the period of the $T_0$ signal, N is the value of input control data N, and $N_{MAX}$ is the maximum value of N. Since in the example of FIG. 2 N is a 10-bit number, $N_{MAX}$ may be as large as 210–1.

Phase shifter 30 includes a tapped delay line 32 formed by a set of buffers 34 connected in series for successively delaying the T0 signal to produce a set of L "tap" signals $TAP_1-T_L$ at the buffer outputs. L may be any value larger than 1 and is determined by the number of buffers forming delay line 32. In the example illustrated in FIG. 2, L is 32. Each successive tap signal $TAP_1-TAP_{32}$ is delayed from its preceding tap signal by the inherent delay of an buffer 34. The $T_0$ and $TAP_{32}$ signals are applied as inputs to a conventional delay lock loop (DLL) controller 36 that provides a BIAS signal to each buffer 34. The BIAS signal controls the inherent delay of each buffer 34. DLL controller 36 adjusts the BIAS signal so that the $TAP_{32}$ signal is phase locked to the $T_0$ signal. Thus the total delay between $T_0$ and $TAP_{32}$ is equal to the period $P_0$ of $T_0$. Since all buffers 34 are similar, each buffer's delay is close to the average buffer delay of $P_0/32$. However there will be some variation in buffer delay due to process or environmental differences between the buffers.

The tap signals $TAP_1-TAP_{32}$ provide inputs to a multiplexer 38 controlled by the upper five bits F of an 13 bit control data value $M_N$. Multiplexer 38 selects one of its input signals $TAP_1-TAP_{32}$ and provides it as an input signal $T_S$ to a programmable delay circuit 40. Delay circuit 40 delays the $T_S$ signal by from 0 to $2^8$ "unit delays" where a unit delay is $P_0/(L*N_{MAX})$. The amount of the delay provided by delay circuit 40 is selected by the lower eight bits G of control data $M_N$. Thus the 13 bit data value $M_N$ controls the phase shift between $T_0$ and $T_{OUT}$ with a resolution of $P_0/(L*N_{MAX})$.

A lookup table 42, suitably a random access memory addressed by a 10-bit input control data value N, stores and reads out a 13-bit delay control data value $M_N$ for each value of N. The particular value of $M_N$ for each value of N is adjusted by writing that value into lookup table 34 via a conventional computer bus 44.

Phase shifter 30 can be calibrated to provide a phase shift between $T_0$ and $T_{OUT}$ that is a linear function of N by appropriately adjusting the value of $M_N$ in table 42 for each value of N. The calibration is performed by using an oscilloscope to monitor the phase difference between $T_0$ and $T_{OUT}$ while iteratively adjusting the value of $M_N$ stored in table 42 for each value of N until phase shifter 30 produces the desired phase shift for that value of N. However manually calibrating phase shifter 30 is tedious and time consuming.

Figure 3:
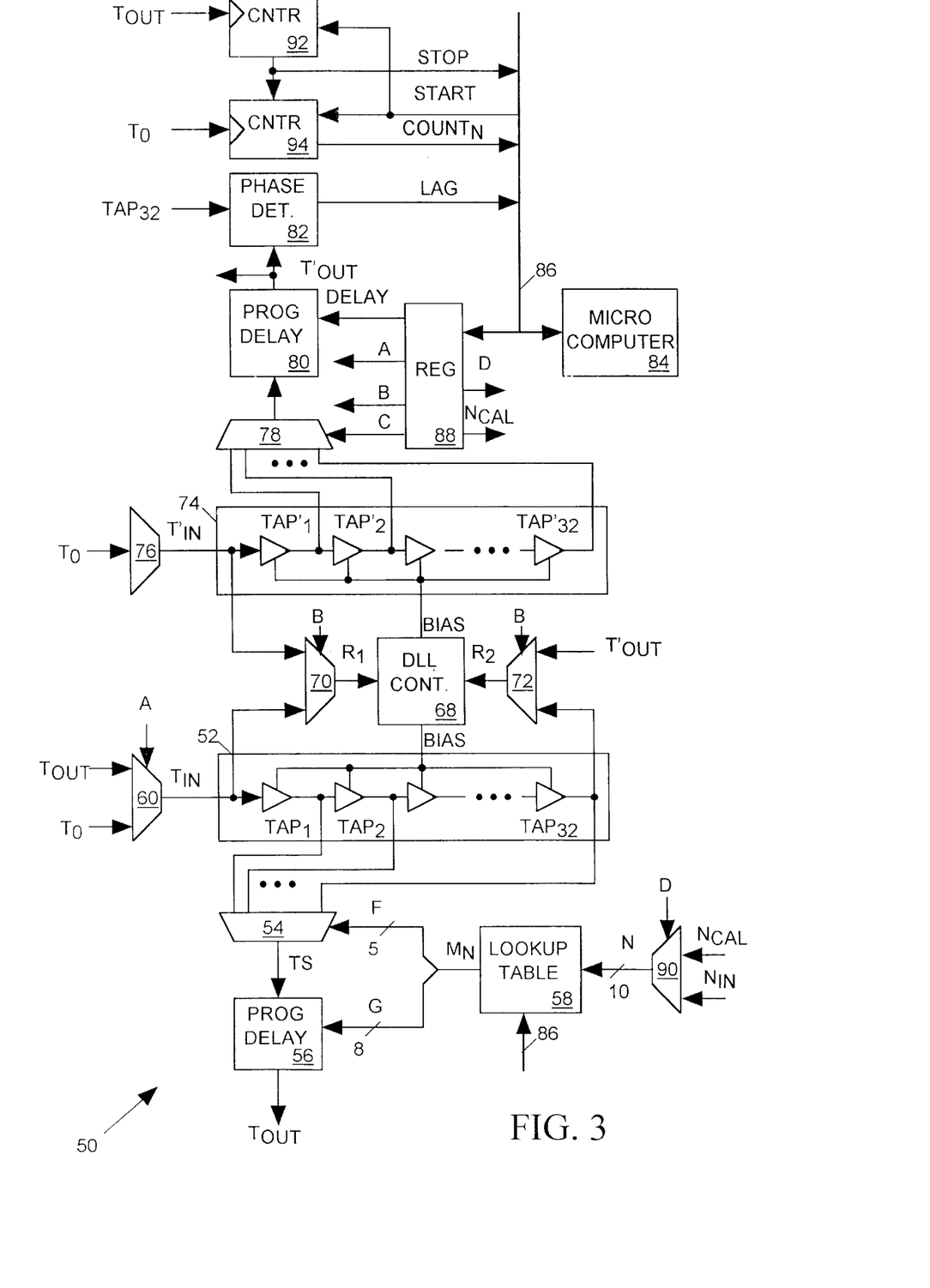
FIG. 3 illustrates a self-calibrating programmable phase shifter in accordance with the present invention.

FIG. 3 illustrates a self-calibrating phase shifter 50 in accordance with the present invention that is an improvement to phase shifter 30 of FIG. 2. Phase shifter 50 includes a programmable delay line 52 receiving the $T_0$ signal and supplying tap signals $T_0-TAP_{32}$ to a multiplexer 54 and a programmable delay circuit 56 for delaying the output $T_S$ of multiplexer 54 to produce the $T_{OUT}$ signal. A lookup table 58 converts the 10-bit input control data N to 13-bit control data $M_N$ for controlling multiplexer 54 and programmable delay circuit 56. A delay lock loop controller 68 adjusts the magnitude of the BIAS signal in response to a phase difference between input reference signals $R_1$ and $R_2$. A multiplexer 60 normally supplies $T_0$ as input signal $T_{IN}$ to delay line 52. A pair of multiplexers 70 and 72 normally deliver the $T_{IN}$ and $TAP_{32}$ signals as reference signals $R_1$ and $R_2$ to DLL controller 68. DLL controller 68 adjusts the magnitude of the BIAS signal so that $TAP_{32}$ is phase locked to $T_{IN}$. During normal operation, after appropriate values for $M_N$ have been loaded into lookup table 58, phase shifter 50 operates in a manner similar to phase shifter 30 of FIG. 2 as described above.

Additional circuitry is included in phase shifter 50 to enable it to carry out a calibration procedure by which it automatically selects a appropriate value of $M_N$ for each value of input control data N so that the phase shift between $T_{OUT}$ and $T_0$ is the desired linear function of N. During the calibration procedure the output signal $T_{OUT}$ of phase shifter 50, instead of the reference signal $T_0$, is connected through a multiplexer 60 to the input of delay line 52. This turns phase shifter 50 into an oscillator in which the period of $T_{OUT}$ is equal to the total delay produced by the value of $M_N$ produced by table 58 for the current input value of N. The magnitude of the BIAS signal output of DLL controller 68 is controlled during the calibration procedure so that total delay through delay line 52 is $P_0$, the period of the $T_0$ signal, as would be the case during normal phase shifter operation. Thus for any given value of $M_N$, the period $P_{OUT}$ of $T_{OUT}$, when phase shifter 50 is set up to act as an oscillator during the calibration procedure, is equal to the phase shift between $T_0$ and $T_{OUT}$ for such value of $M_N$ during normal operation of phase shifter 50. If lookup table 58 is loaded with the proper value of $M_N$ for an input data value N, then the period of $T_{OUT}$ when phase shifter 50 is acting as an oscillator will be the desired $(N/N_{MAX})P_0$. If $M_N$ is too large or too small, then the period of $T_{OUT}$ will too large or too small. The correct value of $M_N$ for each value of N is discovered during the calibration procedure by iteratively adjusting $M_N$ and measuring the resulting period $P_{OUT}$ of $T_{OUT}$ until a suitable value of $M_N$ is found for which $P_{OUT}$ has the desired value.

Accordingly, in accordance with the invention, to measure the period of $T_{OUT}$ for a given value of N, the number of cycles of the reference signal $T_0$ occurring during a predetermined number (LIMIT) of cycles of $T_{OUT}$ is counted. The magnitude of the count is proportional to $P_{OUT}$. As explained in more detail below, if the value of $M_N$ is properly adjusted for a given value of N, then the count ($COUNT_N$) of $T_0$ pulses for any given value of N should be $COUNT_N=(N/N_{MAX})LIMIT$. During the calibration process, if $COUNT_N$ is too high, the current value of $M_N$ stored in table 58 is lowered. If the $COUNT_N$ is too low, the current value of $M_N$ is raised. The calibration process is discussed in more detail below.

Phase shifter 50 is provided with additional circuitry to enable it to carry out the calibration procedure. Another tapped delay line 74, similar to delay line 52, receives the $T_0$ signal via a multiplexer 76 and supplies a set of tap signals $T'_1-T'_{32}$ to a multiplexer 78. (Multiplexer 76 does not have a switching function but provides a signal delay that is equivalent to the inherent delay of multiplexer 60.) Multiplexer 78 supplies a selected one of its input tap signals to a programmable delay circuit 80 which delays its input signal to produce an output signal $T'_{OUT}$. The $T'_{OUT}$ signal and the $TAP_{32}$ output signal of delay line 52 provide input to a phase detector 82. Phase detector 82 asserts an output LAG signal when $T'_{OUT}$ lags $TAP_{32}$ and de-asserts the LAG signal when $T'_{OUT}$ does not lag $TAP_{32}$. The $T_{IN}$ output of multiplexer 76 provides a second input to multiplexer 70 while the $T_{OUT}$ signal provides a second input to multiplexer 72.

A microcomputer 84 controls the calibration process. Microcomputer 84 writes control data into a addressable registers 88 via bus 86. Control data values A, B and C stored in registers 88 set the switching states of multiplexers 60, 70, 72, and 78. A control data value DELAY in one of registers 88 controls the delay of programmable delay circuit 80. Microcomputer 84 can also read the LAG output bit of phase detector 82 via bus 86. During normal circuit operation the value of N supplied to lookup table 58 is controlled by 10-bit input data $N_{IN}$ from an external source via a multiplexer 90. During the calibration procedure the value of N is controlled by a 10-bit data value $N_{CAL}$ in one of registers 88, the $N_{CAL}$ data being supplied as the N input to lookup table 58 via multiplexer 90. A single bit D in registers 88 controls the switching state of multiplexer 90.

A counter 92, when reset and enabled by a START signal from microcomputer 84, counts cycles of the $T_{OUT}$ signal until it reaches the desired count limit (LIMIT). Counter 92 then generates an output STOP signal pulse which sends an interrupt to microcomputer 84 via bus 86. Counter 94, when reset and enabled by the START control signal from microcomputer 84, counts pulses of the $T_0$ signal and produces count data $COUNT_N$ indicating the count. Counter 94 stops its count and holds its last value of $COUNT_N$ upon receiving the STOP pulse output of counter 92. Microcomputer 84 may read the $COUNT_N$ data from an addressable register within counter 94 via bus 86.

As mentioned above, delay lock loop controller 68 sets the BIAS signal so that $R_2$ is in phase with $R_1$. Multiplexer 60 supplies $T_{IN}$ to the input of delay line 52. During normal operation, a pair of multiplexers 70 and 72 deliver the $T_{IN}$ and $TAP_{32}$ signals as reference signals $R_1$ and $R_2$ to DLL controller 68. During the calibration procedure it is necessary to maintain the BIAS signal input to delay line 52 to the same value it has during normal operation of phase shifter 50. Since multiplexer 60 does not supply $T_0$ to delay line 52 during the calibration procedure, DLL controller 68 cannot use $TAP_{32}$ as its $R_2$ input signal source. Accordingly during the calibration procedure, multiplexers 70 and 72 instead supply the $T'_{IN}$ output of multiplexer 76 and the $T'_{OUT}$ signal output of programmable delay circuit 80 as the $R_1$ and $R_2$ inputs to DLL controller 68. If the delay between $T'_{IN}$ and $T'_{OUT}$ during the calibration procedure is the same as the delay between $T_{IN}$ and $TAP_{32}$ during normal circuit operation, then the BIAS signal will have the same value. Thus as a first step in the calibration procedure, with DLL controller 68 delay locking $TAP_{32}$ to $T_{IN}$, microcomputer 84 iteratively adjusts the C and DELAY data values stored in register 88 while monitoring the LAG output signal of phase detector 82 (in a manner described in more detail below) so as to delay lock $T'_{OUT}$ to $TAP_{32}$. Thereafter, during subsequent steps of the calibration procedure when multiplexers 70 and 72 deliver $T'_{IN}$ and $T'_{OUT}$ to DLL controller 68 instead of $T_{IN}$ and $T_{32}$, the BIAS signal output of DLL controller 68 will have the correct value.

Calibration Procedure

Figures 4, 5, 6:
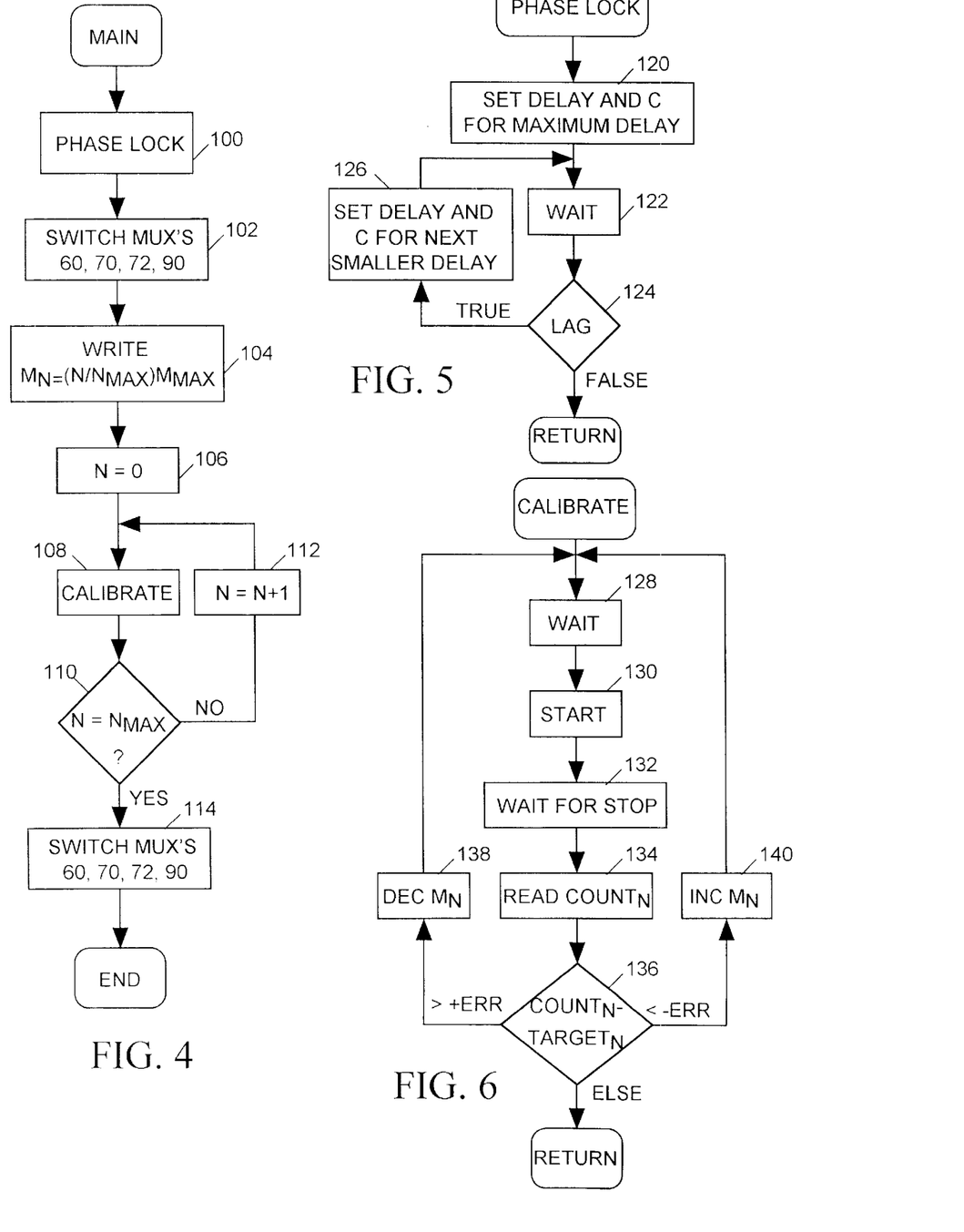
FIG. 4 is a flow chart illustrating a main routine of a calibration algorithm carried out by the microcomputer of the phase shifter of FIG. 3.
FIGS. 5 and 6 are flow charts illustrating subroutines called by the main routine of FIG. 4.

FIG. 4 is a flow chart illustrating a main routine of an algorithm carried out by microcomputer 84 when calibrating phase shifter 50 of FIG. 3. FIGS. 5 and 6 are subroutines called by the main routine.

Main Routine

Referring to FIGS. 3, 4 and 5, microcomputer 84 first (step 100 of FIG. 4) calls a "phase lock" subroutine of FIG. 5 by which microcomputer 84 phase locks the $T'_{OUT}$ signal of delay circuit 80 to the $TAP_{32}$ output signal of delay line 52. (The phase lock subroutine is discussed in detail below.) At step 102 of the main routine, microcomputer 84 switches multiplexer 60 so that $T_{OUT}$ is supplied to the input of delay line 52 instead of $T_0$, thereby turning phase shifter 50 into an oscillator. Microcomputer 84 also switches multiplexers 70 and 72 to provide the $T'_{IN}$ output of multiplexer 76 and the $T'_{OUT}$ output of programmable delay circuit 80 as inputs to delay lock loop controller 68 and switches multiplexer 90 so that the $N_{CAL}$ data output of register 88 controls the data input N to lookup table 58.

At step 104, microcomputer 84 computes a "first guess" value of $M_N$ for each value of N and writes that value of $M_N$ into address N of lookup table 58. The "first guess value" of $M_N$ is suitably computed as $$M_N = (N/N_{MAX})M_{MAX}$$

where $N_{MAX}$ is the maximum value of N and $M_{MAX}$ is the maximum value of $M_N$. Since N of FIG. 3 is a 10-bit number, $N_{MAX}$ is $2^{10}-1$ and since $M_N$ is a 13-bit number M is $2^{13}-1$.

Microcomputer 84 then sets the value of data $N_{CAL}$ in register 88 to 0, thereby setting N=0 (step 106). Microcomputer 84 then (step 108) executes the calibration subroutine of FIG. 6 wherein it iteratively adjusts the value of $M_0$ stored in lookup table 58 until it determines a value of $M_0$ for which $T_{OUT}$ signal has a period of $P_0$, the period of the input reference signal $T_0$. This means that during normal operation of phase shifter 50, when input data N is set to 0, $T_{OUT}$ will be in phase with $T_0$. In other words, when $N_{IN}=N=0$, the phase shift between $T_0$ and $T_{OUT}$ will be 0.

After calibrating $M_0$ at step 108, microcomputer 84 checks whether $N=N_{MAX}$ (step 110), and if not, increments N (step 112) and repeats the calibration subroutine for the new value of N (step 108). When N=1 the calibration routine iteratively adjusts the value of $M_N$ stored in table 58 so that $T_{OUT}$ has a period of $(1/N_{MAX})P_0$. This means that during normal operation of phase shifter 50, an input value of $N_{IN}=N=1$ will provide for a phase shift between $T_0$ and $T_{OUT}$ of $(1/N_{MAX})P_0$.

The calibration process continues to loop through steps 108, 110 and 112, with microcomputer 84 adjusting the value of $M_N$ stored in lookup table 58 for each value of N from 0 to $N_{MAX}$ so that the period $P_{OUT}$ of $T_{OUT}$ is $$P_{OUT} = (N/N_{MAX})P_0.$$

This ensures that the phase shift between $T_0$ and $T_{OUT}$ during normal operation of phase shifter 50 will be a linear function of the input data DIN=N that ranges from 0 to $P_0$ in even steps of $P_0/N_{MAX}$.

When at step 110 N reaches $N_{MAX}$, microcomputer 84 writes appropriate values of control data A, B, and D into register 88 so as to switch multiplexer 60 to select its $T_0$ input, to switch multiplexers 70 and 72 to select the $T_{IN}$ output of multiplexer 60 and the $TAP_{32}$ output of delay line 52, and to switch multiplexer 90 to select its $N_{IN}$ input. This allows phase shifter 50 to resume acting in its normal mode as a phase shifter.

Phase Lock Subroutine

In executing the phase lock subroutine of FIG. 5, microcomputer 84 phase locks $T'_{OUT}$ to $TAP_{32}$, thereby by ensuring that during the calibrate routine, DLL controller 68 will provide the appropriate BIAS signal level to the buffers of delay line 52 of FIG. 3. Referring to FIGS. 3 and 5, at step 120, with multiplexer 60 selecting $T_{IN}$ as input to delay line 52, microcomputer 84 initially sets the values of the DELAY and C data in register 88 so that multiplexer 78 selects the most delayed tap signal T'32 and so that programmable delay circuit 80 provides its largest delay. Thus the delay between $T_0$ and $T'_{OUT}$ is maximized. Microcomputer 84 then waits briefly (step 122) until phase detector 82 has had time to adjust its LAG output signal to indicate whether $T'_{OUT}$ is lagging $TAP_{32}$. Initially, since the delay between $T_0$ and $T'_{OUT}$ is set to a maximum, $T'_{OUT}$ will lag $TAP_{32}$ so the LAG signal will be true. Microcomputer 84 then checks the state of the LAG signal (step 124) and, since LAG is true, it sets the DELAY and C data in register 88 so that delay between $T_0$ and $T'_{OUT}$ is incrementally decreased (step 126) and then repeats steps 122 and 124. If at step 124 the LAG signal is still asserted at step 124, microcomputer 84 again sets DELAY and C to incrementally decrease the delay between $T_0$ and $T'_{OUT}$ (step 126). Microcomputer 84 continues to loop through steps 122, 124 and 126 decrementing the delay between $T'_{OUT}$ and $T_0$ until $T'_{OUT}$ no longer lags $TAP_{32}$ and phase detector 82 sets the LAG signal to false. At that point $T'_{OUT}$ will be substantially in phase with $TAP_{32}$, within the resolution provided by programmable delay circuit 80. The subroutine then returns to step 102 of the main routine of FIG. 4.

Calibrate Subroutine

After writing a value of $N_{CAL}=N$ into register 88 at step 106 of the main routine of FIG. 4, microcomputer 84 executes the calibrate routine of FIG. 6. In the calibrate subroutine, microcomputer 84 iteratively adjusts the value of $M_N$ stored in lookup table 58 for a current value of N supplied as input to table 58 so that the period $P_{OUT}$ of $T_{OUT}$ is $$P_{OUT}=(N/N_{MAX})P_0.$$

Microcomputer 84 ascertains the period of $P_{OUT}$ by monitoring the $COUNT_N$ output of counter 94.

Starting at step 128, microcomputer 84 waits briefly for the period of $T_{OUT}$ to stabilize after having altered the value of N. It then transmits a START signal pulse to counters 92 and 94 of FIG. 3. The START signal pulse resets both counters and allows them to begin counting pulses of their input signals (step 130). Microcomputer 84 then waits for counter 92 to generate its output STOP signal (step 132). In the meantime counter 92 counts pulses of the $T_{OUT}$ signal while counter 94 counts pulses of the $T_0$ signal. Counter 92 generates its output STOP signal pulse when it reaches the predetermined count limit (LIMIT), for example $2^{15}$. The STOP signal pulse tells counter 94 to stop counting and tells microcomputer to read the count output ($COUNT_N$) of counter 94 (step 134).

Microcomputer 84 adjusts $M_N$ so that $T_{OUT}$ has a period $$P_{OUT}=(N/N_{MAX})P_0.$$

When $M_N$ is correctly set, counter 94 will count $N_{MAX}/N$ pulses of $T_0$ for every $T_{OUT}$ pulse. In such case, during the time between the START and STOP pulses, counter 92 will count LIMIT pulses of $T_{OUT}$ and counter 94 will count $(N_{MAX}/N)$LIMIT pulses of $T_0$. The desired "target" value of $COUNT_N$ for any given value of N is $$TARGET_N=(N_{MAX}/N)LIMIT$$

within the resolution of programmable delay circuit 56. Thus during the calibrate subroutine of FIG. 6 microcomputer 84 adjusts $M_N$ so that $COUNT_N$ is as close as possible to $TARGET_N$. The value of LIMIT should be selected to be somewhat larger than $M_{MAX}$ to provide adequate resolution in the adjustment of $M_N$. Since $M_{MAX}$ is $2^{13}$ a value of LIMIT=$2^{15}$ is sufficient.

Therefore, after reading the value of $COUNT_N$ at step 134, microcomputer compares $COUNT_N$ to $TARGET_N$ (step 136). If $COUNT_N$ is larger then $TARGET_N$ is by more than a tolerable error amount (ERR), microcomputer 84 decrements $M_N$ (step 138) and repeats steps 128–136. If $TARGET_N$ exceeds $COUNT_N$ by more than ERR, microcomputer 84 increments $M_N$ (step 140) and repeats steps 128–136. The calibrate subroutine ends and returns to the main routine when the absolute value of $COUNT_N-TARGET_N$ is less than the small ERR amount. The value of ERR is suitably LIMIT/$M_{MAX}$ which is the smallest amount by which $COUNT_N$ changes in response to a unit change in $M_N$.

Programmable Delay Circuit

Figure 7:
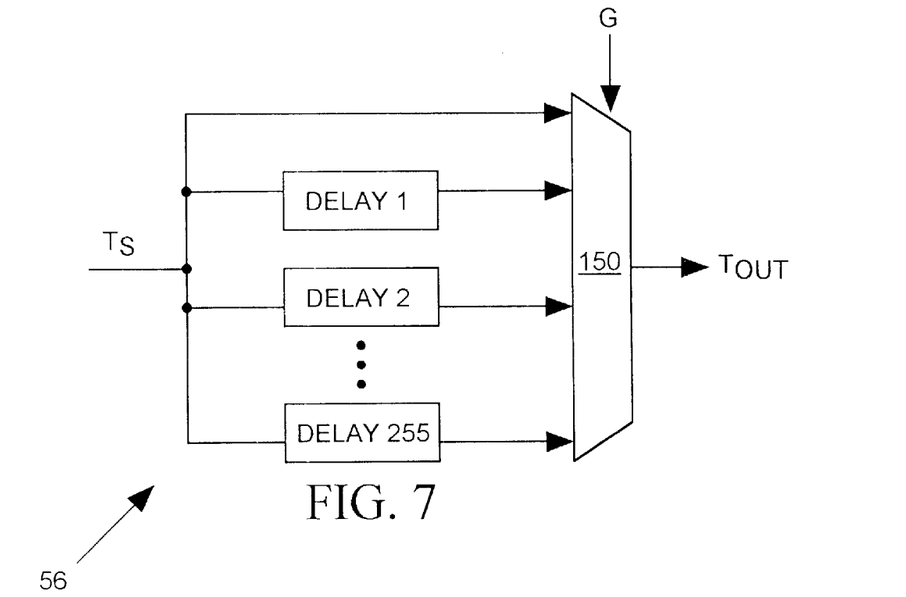
FIG. 7 illustrates the programmable delay circuit of FIG. 3 in more detailed block diagram form.

Any of many prior art programmable delay circuits can be used to implement programmable delay circuit 56 (or 80) of FIG. 3. FIG. 7 illustrates a version of programmable delay circuit 56 including a set of 31 delay elements DELAY 1–DELAY 255 each delaying the $T_S$ signal by a different amount to provide a separate input to a multiplexer 150 controlled by the lower 5 bits G of $M_N$. The $T_S$ signal is also supplied to another input of multiplexer 150. Multiplexer 150 delivers one of its inputs to its output as $T_{OUT}$. The Kth delay element DELAY K, which may be a series of logic gates, is sized to provide a nominal delay of $K(P_0/2^{13})$.

Alternative Lookup Table and Calibration Procedure

The calibration procedure of FIG. 4 assumes that lookup table 58 of FIG. 3 stores a separate value of $M_N$ for each value of N as would be the case when table 58 is implemented by a random access memory (RAM) addressed by N and having $N_{MAX}$ storage locations, each for storing a 13-bit $M_N$ value. However when $N_{MAX}$ is large, a rather large RAM is needed to implement table 58. Also the calibration procedure illustrated in FIG. 4 can be rather lengthy since it must call and execute the iterative CALIBRATE procedure for each of the $N_{MAX}$ values of $M_N$ stored in lookup table 58.

Figure 8:
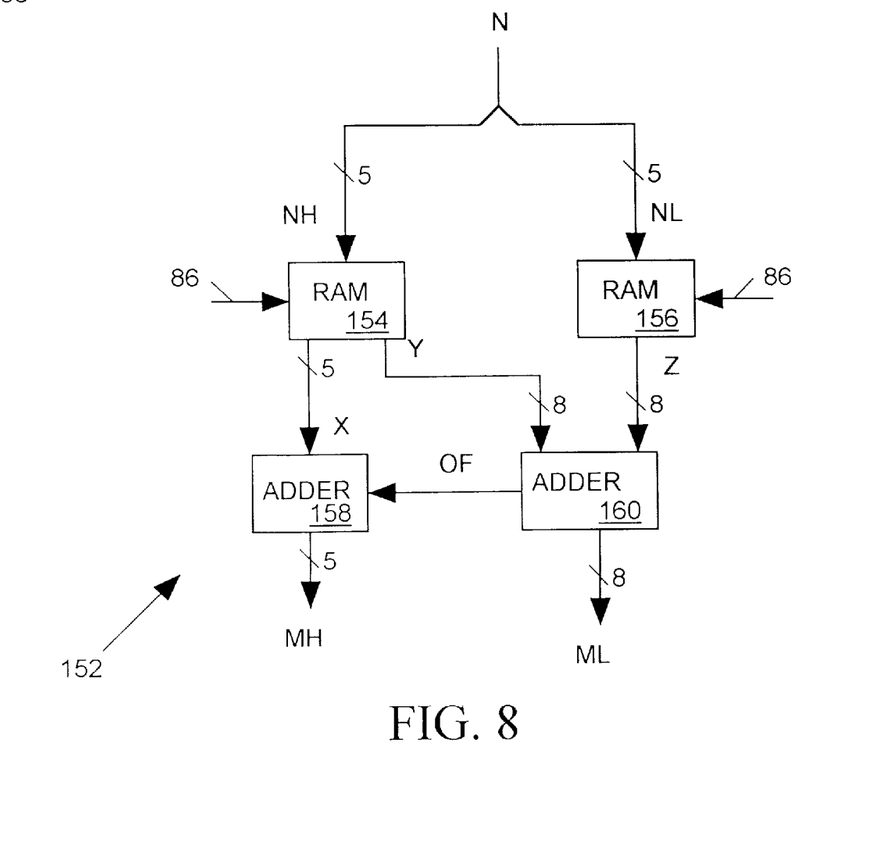
FIG. 8 illustrates an alternative embodiment of the lookup table of FIG. 3 in block diagram form.

FIG. 8 illustrates an alterative version 152 of lookup table 58 that employs two small RAMS 154 and 156, each having $2^5$ storage locations, rather than one large RAM having $2_{10}$ storage locations. RAM 154, addressed by the upper 5 bits NH of the input N data value, stores a 5-bit value X and an 8-bit value Y at each address. RAM 156, addressed by the lower 5 bits NL of N, stores an 8-bit value Z. The architecture of table 152 of FIG. 8 requires microcomputer 84 to calibrate the phase shifter only for each of the $2^5$ possible values of the upper 5 bits NH and for each of the $2^5$ possible values of the lower 5 bits NL of N rather than for all $2^{10}$ possible values of N.

Figure 9:
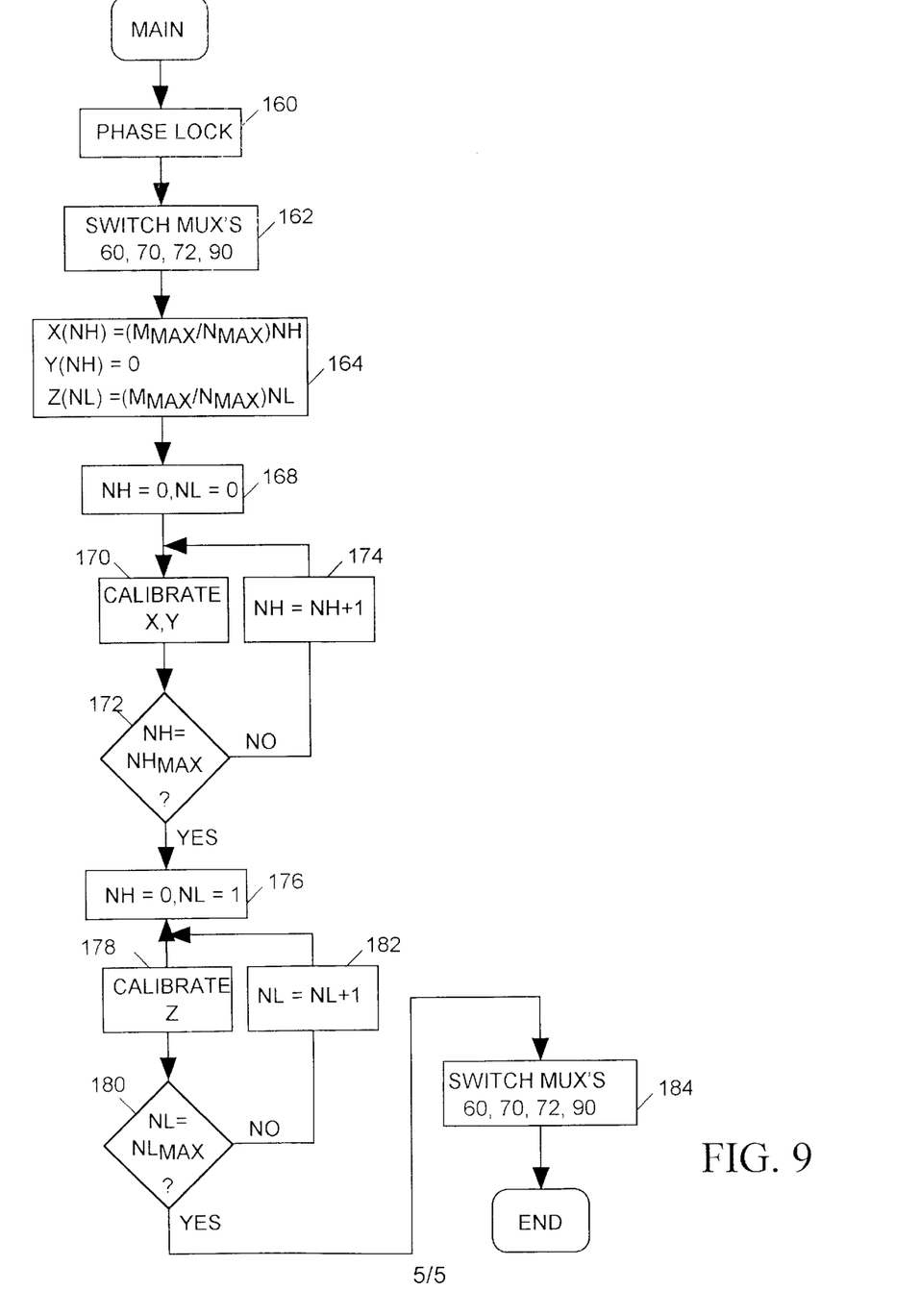
FIG. 9 is a flow chart illustrating a calibration algorithm carried out by the microcomputer of the phase shifter of FIG. 3 when the lookup table of FIG. 3 is replaced with the alternative embodiment illustrated in FIG. 8.

FIG. 9 illustrates a modified calibration process that is used when table 152 of FIG. 8 implements table 58 of FIG. 3. Referring to FIGS. 3 and 9, microcomputer 84 initially executes the phase lock subroutine illustrated in FIG. 5 to bring $T'_{OUT}$ into phase with $TAP_{32}$ (step 160), and then switches multiplexer 60, 70, 72 and 90 to feed $T_{OUT}$ back to delay line 52, to select the $T'_{IN}$ output of multiplexer 76 and $T'_{OUT}$ as inputs to DLL controller 68, and to select $N_{CAL}$ as the N input to lookup table 58 (step 162). Microcomputer 84 then (step 164) computes and stores at each address NH or NL of RAMs 154 and 156 "first guess" values for X, Y and Z. Microcomputer 84 suitably sets the value of X(NH) stored at each address NH in RAM 154 to $(M_{MAX}/N_{MAX})$NH, sets the value of Y(NH) at each address NH to 0, and sets the value of Z at each address NL of RAM 156 is set to $(M_{MAX}/N_{MAX})$NL (step 164).

Thereafter microcomputer 84 sets $N=N_{CAL}$ so that NH and NL are both 0 (step 168). Microcomputer 84 then calls a "calibrate X,Y" routine (similar to the calibrate routine of FIG. 6) which iteratively adjusts the values of X and Y stored at address NH=0 of RAM 154 of FIG. 8 until $T_{OUT}$ has the appropriate period as indicated by the $COUNT_N$ output of counter 94. (Note that since the value of Z stored at address NL=0 of RAM 156, the period of $T_{OUT}$ is totally dependent on the value of X and Y stored at address NH=0.) Since at step 172, NH is not yet equal to $NH_{MAX}$ (the largest possible value of NH) microcomputer 84 next increments NH (step 174) so that N=(NH,NL)=(00001,00000). It then recalls the calibrate X,Y subroutine at step 170 to adjust the value of X,Y stored at address NH=1 of RAM 154 so that $T_{OUT}$ has the desired period as indicated by the $COUNT_N$ data. Microcomputer 84 continues to loop through steps 170, 172 and 174 until it has stored appropriate X,Y values in all address of RAM 154.

When NH reaches $NH_{MAX}$ at step 174, microcomputer 84 sets N=(NH,NL)=(00000,00001) (step 176) and calls a "calibrate Z" subroutine (step 178) similar to the calibrate subroutine of FIG. 6 except that it iteratively adjusts the value of Z stored at address NL=1 of RAM 156 until $COUNT_N$ exhibits its target value. Since at step 180 NL is not yet equal to $NH_{MAX}$ (the largest possible value of NH), microcomputer 84 next increments NL (step 182) so that N=(NH,NL)=(00000,00010). It then recalls the calibrate Z subroutine at step 178 to adjust the value of Z stored at address NL=1 of RAM 156 so that $T_{OUT}$ has the desired period as indicated by the $COUNT_N$ data. Microcomputer 84 continues to loop through steps 176, 178 and 182 until it has stored appropriate Z values in all address of RAM 156. When NL reaches $NL_{MAX}$ at step 180, microcomputer 84 switches multiplexers 60, 70, 72 and 90 to return the phase shifter back to its normal mode of operation (step 184). The calibration routine then ends.

Thus has been shown and described a self-calibrating, programmable phase shifter in accordance with the present invention. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for phase shifting a periodic reference signal $T_O$ with a phase shift that is a predetermined function of a value of input first control data N, thereby to produce an output signal $T_{OUT}$, the apparatus comprising:

adjustable delay means for receiving and delaying a periodic first input signal $T_{IN}$ by an adjustable delay time thereby to produce output signal $T_{OUT}$, wherein said adjustable delay time is a function of a value of second control data $M_N$ provided as input thereto;

first multiplexer means for receiving said periodic reference signal $T_0$, for receiving said output signal $T_{OUT}$, and for alternately providing one of said periodic reference signal $T_O$ and said output signal $T_{OUT}$ as said periodic first input signal $T_{IN}$ to said adjustable delay means;

data conversion means for receiving said input first control data N and for providing in response thereto said second control data $M_N$ to said adjustable delay means, wherein a value of said second control data $M_N$ is an adjustable function of a value of said input first control data N; and calibration means for adjusting said adjustable function so that when said first multiplexer means provides said output signal $T_{OUT}$ as said periodic first input signal $T_{IN}$ to said adjustable delay means, a period of output signal $T_{OUT}$ is said predetermined function of said input first control data N.

2. The apparatus in accordance with claim 1 wherein said adjustable delay means comprises:

tapped delay means for receiving and delaying said periodic first input signal $T_{IN}$ to produce a plurality of tap signals TAP each delayed from $T_{IN}$ by a differing amount;

programmable delay means for delaying a selected tap signal $T_S$ by an adjustable amount of time to produce said output signal $T_{OUT}$; and second multiplexer means for receiving said tap signals TAP, selecting one of said TAP signals and providing it to said programmable delay means as said selected tap signal $T_S$, wherein said second control data $M_N$ controls the selection made by said second multiplexer means and controls the adjustable amount of time said programmable delay means delays said selected tap signal $T_S$.

3. The apparatus in accordance with claim 2 wherein said tapped delay means comprises a plurality of logic gates connected in series.

4. The apparatus in accordance with claim 1 wherein said data conversion means comprises a random access memory storing values of said second control data $M_N$ at addresses addressed by said input first control data N.

5. The apparatus in accordance with claim 1 wherein said data conversion means comprises:

a first random access memory (RAM) addressed by a first portion of said input first control data N and reading out first data X,Y when addressed, a second RAM addressed by a second portion of said input first control data N and reading out second data Z when addressed, and means for logically combining said first data X,Y and said second data Z to produce said second control data $M_N$.

6. The apparatus in accordance with claim 1 wherein the phase shift between said output signal $T_{OUT}$ and said periodic reference signal $T_0$ is a non-linear function of a value of said second control data $M_N$.

7. The apparatus in accordance with claim 1 wherein said predetermined function is a substantially linear function.

8. The apparatus in accordance with claim 1 wherein said calibration means comprises:

period measurement means for responding to an input START signal by producing period data indicating a period of said output signal $T_{OUT}$ when said first multiplexer means provides said output signal $T_{OUT}$ as said periodic first input signal $T_{IN}$ to said adjustable delay means, and control means for signaling said first multiplexer means to provide said output signal $T_{OUT}$ as said periodic first input signal $T_{IN}$ to said adjustable delay means, for successively providing values of said input first control data N to said data conversion means, for supplying the START signal to said period measurement means, for receiving said period data produced by said period measurement means, and for adjusting said adjustable function so that the period of output signal $T_{OUT}$ indicated by said period data is said predetermined function of said values of said input first control data N.

9. The apparatus in accordance with claim 8 wherein said period measurement means comprises:

first counter means for counting cycles of said output signal $T_{OUT}$, and second counter means for counting cycles of said periodic reference signal $T_0$.

10. The apparatus in accordance with claim 9 wherein said first counter means begins counting cycles of said output signal $T_{OUT}$ in response to said START signal and produces an output STOP signal when the number of counted cycles of said output signal $T_{OUT}$ reaches a predetermined limit, and wherein said second counter means begins counting cycles of said periodic reference signal $T_0$ in response to said START signal and stops counting cycle of said periodic reference signal $T_0$ in response to said STOP signal.

11. The apparatus in accordance with claim 10 wherein said control means responds to STOP signal by obtaining said period data.

12. An apparatus for phase shifting a periodic reference signal $T_O$ with a phase shift that is a predetermined function of a value of input data N, thereby to produce an output signal $T_{OUT}$, the apparatus comprising:

first tapped delay means for receiving and delaying a periodic first input signal $T_{IN}$ to produce a plurality of first tap signals TAP that are distributed in phase, with an amount of phase separation between said first TAP signals being controlled by a magnitude of a BIAS signal;

second tapped delay means for receiving and delaying a second periodic input signal $T'_{IN}$ to produce a plurality of second tap signals TAP' that are distributed in phase, with an amount of phase separation between said TAP' signals being controlled by the magnitude of said BIAS signal;

delay lock control means for producing said BIAS signal with a magnitude that is proportional to a phase difference between an input first reference signal $R_1$ and an input second reference signal $R_2$;

first multiplexer means for receiving said first input signal $T_{IN}$ and said second input signal $T'_{IN}$ and for providing a selected one of said first and second input signals $T_{IN}$ and $T'_{IN}$ as said first reference signal $R_1$ input to said delay lock control means in response to input first select data B;

second multiplexer means for receiving one of said TAP signals and one of said TAP' signals and for providing a selected one of the receive TAP and TAP' signals as said second reference signal $R_2$ input to said delay lock control means in response to said first select data B.

13. The apparatus in accordance with claim 12 wherein said first tapped delay means comprises a plurality of substantially similar logic gates connected in series, each logic gate receiving said BIAS signal as an input and having a switching speed controlled by said bias signal.

14. The apparatus in accordance with claim 12 further comprising:

programmable delay means for delaying a selected tap signal $T_S$ by an adjustable amount of time to produce said output signal $T_{OUT}$, said adjustable amount of time being controlled by input delay control data G;

third multiplexer means for receiving said first tap signals TAP, for selecting one of said first TAP signals in response to input second select data F and providing it to said programmable delay means as said selected tap signal $T_S$, fourth multiplexer means for receiving said reference signal $T_0$, for receiving said output signal $T_{OUT}$, and for providing one of said periodic reference signal $T_O$ and said output signal $T_{OUT}$ selected in response to input third select data A as said first input signal $T_{IN}$ to said first tapped delay means;

means for delivering said reference signal $T_O$ as said second input signal $T'_{IN}$ to said second tapped delay means.

15. The apparatus in accordance with claim 14 further comprising data conversion means for receiving said input data N and for providing in response thereto output data $M_N$, wherein a value of said output data $M_N$ is an adjustable function of a value of said input data N, wherein said output data $M_N$ includes bits forming said second select data F provided to said third multiplexer means and bit forming said delay control data G input to said programmable delay means.

16. The apparatus in accordance with claim 15 wherein said data conversion means comprises a random access memory storing values of said output data $M_N$ at addresses addressed by said input data N.

17. The apparatus in accordance with claim 15 wherein said data conversion means comprises:

a first random access memory (RAM) addressed by a first portion of said input data N and reading out first data X,Y when addressed, a second RAM addressed by a second portion of said input data N and reading out second data Z when addressed, and means for logically combining said first data X,Y and said second data Z to produce said output data $M_N$.

18. The apparatus in accordance with claim 15 further comprising calibration means for adjusting said adjustable function so that a period of output signal $T_{OUT}$ is said predetermined function of said input data N.

19. The apparatus in accordance with claim 18 wherein the phase shift between said output signal $T_{OUT}$ and said periodic reference signal $T_0$ is a non-linear function of a value of said output data $M_N$ and wherein said predetermined function is a linear function.

20. The apparatus in accordance with claim 18 wherein said calibration means comprises:

period measurement means for responding to an input START signal by producing period data indicating a period of said output signal $T_{OUT}$ when said fourth multiplexer means provides said output signal $T_{OUT}$ as said periodic first input signal $T_{IN}$ to said first tapped delay means, and control means for providing said input first select data B to said first and second multiplexer means, for providing said input third select data A to said fourth multiplexer means, for successively providing values of said input data N to said data conversion means, for supplying the START signal to said period measurement means, for receiving said period data produced by said period measurement means, and for adjusting said adjustable function so that the period of output signal $T_{OUT}$ indicated by said period data is said predetermined function of said values of said input data N.

21. The apparatus in accordance with claim 20 wherein said period measurement means comprises:

first counter means for counting cycles of said output signal $T_{OUT}$, and second counter means for counting cycles of said periodic reference signal $T_0$.

22. The apparatus in accordance with claim 21 wherein said first counter means begins counting cycles of said output signal $T_{OUT}$ in response to said START signal and produces an output STOP signal when the number of counted cycles of said output signal $T_{OUT}$ reaches a predetermined limit, and wherein said second counter means begins counting cycles of said periodic reference signal $T_0$ in response to said START signal and stops counting cycle of said periodic reference signal $T_0$ in response to said STOP signal.

23. The apparatus in accordance with claim 22 wherein said control means responds to STOP signal by obtaining said period data.

24. A self-calibrating programmable phase shifter comprising:

a tapped delay line for successively delaying a periodic reference signal to produce a set of phase distributed tap signals;

a programmable delay circuit;

a multiplexer for selecting one of the tap signals as input to said programmable delay circuit which further delays the selected tap signal to produce an output signal that is phase shifted from the reference signal;

conversion means for converting input data having a value indicating a desired phase shift between the reference signal and the output signal into output data for controlling the multiplexer selection and an amount of delay provided by the programmable delay circuit; and calibration means for converting the phase shifter into an oscillator by feeding the output signal back as input to the tapped delay line instead of said reference signal, and adjusting a manner in which said conversion means converts said input data into said output data so that a period of the output signal has a predefined relationship to the value of said input data.

\* \* \* \* \*